(12) United States Patent
Chung et al.

(10) Patent No.: US 7,649,246 B2
(45) Date of Patent: Jan. 19, 2010

(54) TAB PACKAGE CONNECTING HOST DEVICE ELEMENT

(75) Inventors: Ye-chung Chung, Suwon-si (KR); Sa-yoon Kang, Seocho-gu (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 433 days.

(21) Appl. No.: 11/396,526

(22) Filed: Apr. 4, 2006

(65) Prior Publication Data

US 2006/0267164 A1    Nov. 30, 2006

(30) Foreign Application Priority Data

May 24, 2005    (KR) .................... 10-2005-0043810

(51) Int. Cl.
*H01L 23/495* (2006.01)
(52) U.S. Cl. .............. 257/668; 257/E23.034; 257/E23.055; 257/692; 438/123
(58) Field of Classification Search .......... 257/E23.034, 257/E23.055, 668
See application file for complete search history.

(56) References Cited

U.S. PATENT DOCUMENTS

| | | | |
|---|---|---|---|
| 4,680,613 A | | 7/1987 | Daniels et al. |
| 5,920,115 A | * | 7/1999 | Kimura et al. ............... 257/668 |
| 6,310,299 B1 | | 10/2001 | Kim |
| 6,555,755 B1 | | 4/2003 | Yanagisawa |
| 6,841,737 B2 | | 1/2005 | Komatsubara et al. |
| 2002/0079124 A1 | * | 6/2002 | Moden ..................... 174/94 R |

* cited by examiner

*Primary Examiner*—Thao X Le
*Assistant Examiner*—Ajay K Arora
(74) *Attorney, Agent, or Firm*—Muir Patent Consulting, PLLC

(57) ABSTRACT

A device is provided in which a glass panel having beveled edge is flexibly connected to a TAB package. The outer lead portions of the TAB package include an end portion of first width connected to a connection pattern on the glass panel, a terminal portion having a second width greater than the first width, and a transition portion having a width that varies between the first and second widths. When the TAB package is connected the transition portion of the respective outer lead portions are disposed over the beveled edge of the glass panel.

19 Claims, 8 Drawing Sheets

COF

TCP

TAB PACKAGE CONNECTING HOST DEVICE ELEMENT

BACKGROUND OF THE INVENTION

1. Field of the Invention

Embodiments of the invention relate generally to semiconductor devices, and host devices incorporating same. More particularly, embodiments of the invention relate to a tape automated bonding (TAB) packages adapted to flexibly connect a host device element, such as a glass panel.

2. Description of the Related Art

The computational and data manipulation circuitry of semiconductor devices is implemented on small dies formed on portions of a silicon wafer. In and of themselves, semiconductor dies are very small and quite fragile. That is, in their native "cut-from-the-wafer" state, semiconductor dies—while fully functional in their circuitry—are not very useful since their fragile nature prevents practical integration within a host device, and their small size precludes most conventional connections to their internal circuitry. Thus, the need for effective semiconductor packaging techniques arises. The terms "package" or "packaging" in this context refer to any material or technique adapted to provide physical protection and/or electrical connection to/from a semiconductor die.

Semiconductor devices, such as microelectronic devices, memory devices, etc., typically encase their constituent semiconductor die in a package or housing in order to provide the die with protection from mechanical shock and/or the corrosive effects of the surrounding environment. Semiconductor die packages come in a variety of form factors and types. One common package encases the semiconductor die between a base and a cover. Another common package encapsulates the semiconductor die in a plastic or resin compound.

Electrical connection to the Input/Output (I/O) pads of a semiconductor die is commonly provided by a leadframe. Here again, leadframes come in many different form factors, but generally provide electrical connection between a variety of external circuits and the I/O pads of a semiconductor die through the packaging materials. A leadframe may be connected to a semiconductor die using one of several conventional techniques. Two conventional techniques adapted to the connection of a leadframe with respective I/O pads on a semiconductor device involve the respective use of thin wire bonds or an interconnect tape.

Techniques using an interconnect tape are commonly referred to as "tape automated bonding (TAB)". In TAB, electrical connections (e.g., connections to power lines, and/or signal lines, etc.) are patterned onto the interconnect tape. During an interconnection process, a semiconductor die is positioned over the tape such that bonding sites (e.g., leads or pads formed on the semiconductor die) are aligned with respective interconnections on the tape. The semiconductor die is then bonded in place using metal bumps or solder balls, for example.

Once connection is properly established between bonding pads on the semiconductor die and the interconnect tape, the semiconductor die is able to make use of a connection pattern formed on the tape. This connection pattern most typically takes the form of a plurality of thin metal leads. Each one of the plurality of leads includes an "inner lead" or "inner lead portion." The very fine and somewhat fragile nature of the inner leads preclude their direct use as electrical connections to external circuits. Thus, as each respective inner lead extends outward from the semiconductor die it migrates in form to a more robust (e.g., thicker and stronger) structure termed an "outer lead" or "outer lead portion." Outer lead portions are adapted to be bonded to a leadframe, a circuit board, an external circuit connection, or a signal line, etc. Thus, an individual lead typically comprises an inner lead portion connected to a bonding pad on the semiconductor die and an outer lead portion bonded to a leadframe, a printed circuit board, an external circuit connection, or a signal line, etc.

The flexible interconnect tape used in TAB processes comes in several different types; for example, a single layer type having an all metal (or metalized) construction, a two layer type having a metal layer supported on a dielectric backing layer (e.g. a base film), or a three layer type having metal layer bonded by an adhesive layer to a dielectric layer. In TAB interconnect tape types incorporating a dielectric, the dielectric is typically formed from a polymide of about 2 to 5 mils in thickness. In contrast, the metal layer is usually formed from a highly conductive material such as copper or a dilute copper alloy and has a typical thickness ranging from 0.5 to 6 mils. Standard size interconnect tapes have widths of, for example, 35 mm, 45 mm and 70 mm, and thicknesses ranging from about 50 to 100 microns.

Leads may be formed from the metal layer of an interconnect tape using conventional photolithography processes. Lead portion widths as thin as 2 mils are commonly fabricated.

TAB provides several advantages over wire bonding techniques. These advantages include: smaller bonding pad structures and a finer bonding pitch, reduced use of gold, a smaller bond geometry, increased production rates, and stronger, more uniform inner lead bonding. TAB produced devices are physically flexible and facilitate multi-chip module manufacturing.

Thus, TAB is often a better production alternative over wire bonding techniques for applications within host devices requiring very fine bond pitches, reduced die size, and higher semiconductor device densities. TAB is also the fabrication technique of choice for semiconductor devices that routinely experience physical motion or stress (e.g., bending, torque, compressive or tensile stressing, etc.) in their use within a host device. A requirement for reliable use under physical motion or stress is often placed on some semiconductor devices used, for example, within LCD panels, printers, folding gadgets like cell phones, laptops, PDAs, etc.

However, the incorporation of a TAB fabricated semiconductor device within host devices poses many challenges. Consider, for example, the difficulties inherent in the incorporation a TAB package, such as a tape carrier package (TCP) or a Chip-On-Film package (COF) within host devices such as laptop computers, PDAs, cell phones, GPS devices, digital video cameras, etc.

Conventional COF packages and TCPs differ in several aspects. For example, TCPs are often formed with a window cut-out in the tape to allow backside visibility and access to a mounted semiconductor die, whereas COF packages typically omit the window. The interconnect tape used in COF packages generally tends to be thicker than the interconnect tape used in TCPs. In the description that follows, the term "TAB package" generally refers to any semiconductor package formed using a TAB process, and specifically includes at least TCP and COF package types.

TCP and COF packages are frequently used as Liquid Crystal Display (LCD) drivers (termed LDIs) in certain host devices. Indeed, LDIs implemented using a TCP or a COF package are often used to physically bridge LCD arrays with a separate printed circuit board (PCB) comprising a driver, controller or similar computational/data manipulation hardware. The use of flexible semiconductor packaging and connections techniques to implement (or facilitate the implementation of) moveable joints between elements of a host device has enabled many new consumer products that are compact, elegant and versatile.

However, these developments have placed increasing importance on the long-term reliability of TAB packages used in such applications. Several problems associated with the use of a TAB package as a flexible connection between host device elements will be described in relation to a selected example. This example involves the connection of a glass panel, such as those commonly used in LCD displays, with another host device element, such as a PCB containing a driver circuit or controller. This example is illustrated collectively in Figures (FIGS.) 1A through 1C and FIG. 2.

FIG. 2 is a cross-sectional view showing a glass panel 2 connected to one end of a TAB package 5. Glass panel 2 generally comprises a cover portion 2a and a connection portion 2b having a beveled edge 8. A connection pattern 3 formed on glass panel portion 2b is electrically connected to a connection pattern 6 formed on TAB package 5 via an anisotropic conductive film (ACF) 4. The use of ACF in this regard is well understood. In the illustrated example, both connection patterns (3 and 6) are implemented as a plurality of parallel leads.

Related FIGS. 1A, 1B, and 1C further illustrate the problems commonly attendant to the foregoing arrangement. By design, TAB package 5 is intended to facilitate a folding motion (e.g., bending) in the direction indicated by arrow 9 over beveled edge 8 for the other host device element (not shown) connected to the other end of TAB package circuit 5. This folding motion places stress on the outer lead portions 6a of connection pattern 6. This stress tends to concentrate in a region of connection pattern 6 between the ACF 4 bonded outer lead portions 6a and the solder resist 7 reinforced portion of connection pattern 6, (e.g., the terminal portions of the plurality of leads). As indicated in FIGS. 1B and 1C, the connection pattern portions within this stressed region are more prone to cracking. Potential cracking of the outer lead portions is an obvious negative and will dramatically impact the overall reliability of the host device incorporating the TAB package connecting the glass panel. Over time, however, repeated motion between the host device elements flexibly connected by the TAB package may result in exactly this negative outcome.

SUMMARY OF THE INVENTION

Embodiments of the invention provide an improved TAB package better adapted to resist the mechanical stress associated with movement of connected host device elements.

Thus, in one embodiment the invention provides a device, comprising; an element comprising a connection surface, the connection surface comprising a connection region, an edge region, and a first connection pattern formed on the connection surface, and a tape automated bonding (TAB) package. The TAB packages comprises; a semiconductor die connected to a second connection pattern formed by a plurality of leads, wherein each lead comprises an outer lead portion and a corresponding inner lead portion connected to the semiconductor die. Each outer lead portion comprises; an end portion having a first width, a terminal portion having a second width greater than the first width and being connected to the corresponding inner lead portion, and a transition region having a width that varies between the first and second widths, wherein each end portion is electrically connected to a portion of the first connection pattern such that each transition portion overlays the edge region.

In another embodiment, the invention provides a device comprising; a glass panel flexibly bonded to a tape automated bonding (TAB) package, wherein the glass panel comprises a connection surface with a first connection pattern formed thereon, and an edge region formed by a beveled outer edge of the connection surface, and the TAB package comprises a flexible interconnect tape with a lead formed thereon, and a semiconductor die connected to the lead, the lead comprising an outer portion. The outer lead portion comprises an end portion having a first width aligned with and bonded to the first connection pattern, a terminal portion having a second width, and a transition portion having a width that varies between the first and second widths and overlaying the edge portion of the glass panel.

In yet another embodiment, the invention provides a device, comprising; a glass panel and a printed circuit board (PCB) flexibly connected via a tape automated bonding (TAB) package, wherein the glass panel comprises a connection pattern formed on a connection surface, and an edge region formed by a beveled outer edge of the connection surface, and wherein the TAB package comprises a semiconductor die and an outer lead portion, the outer lead portion comprising an end portion having a first width aligned with and bonded to the connection pattern, a terminal portion having a second width greater than the first width and being connected to the semiconductor die, and a transition portion having a width that varies between the first and second widths and overlaying the edge portion of the glass panel.

In still another embodiment, the invention provides a method of bonding a tape automated bonding (TAB) package to a glass panel, wherein the glass panel comprises a connection surface having a beveled end and a first connection pattern formed on the connection surface, and wherein the TAB package comprises a plurality of leads forming a second connection pattern, each lead comprising an outer lead portion, wherein the outer lead portion comprises an end portion having a first width, a terminal portion having a second width greater than the first width, and a transition portion having a width that varies between the first and second widths. The method comprises aligning the first and second connection patterns such that the respective transition portions of the plurality of leads forming the first connection pattern overlay the beveled end of the glass panel, and bonding the respective end portions of the plurality of lead forming the first connection pattern to the second connection pattern.

In a related aspect, the TAB package in any one of the foregoing embodiments may comprise a Chip-On-Film (COF) package or a Tape Carrier Package (TCP).

BRIEF DESCRIPTION OF THE DRAWINGS

Exemplary embodiments of the invention will be described hereafter with reference to the attached drawings in which like reference numerals refer to like or similar elements. The drawings include.

Figures (FIGS.) 1A, 1B, and 1C and FIG. 2 which collectively illustrate mechanical stress problems associated with conventional TAB packages connecting host device elements.

DESCRIPTION OF EXEMPLARY EMBODIMENTS

Selected features and advantages associated with several embodiments of the invention are described hereafter with reference to the accompanying drawings. The invention may, however, be implemented in various embodiments. The nature, construction, and compostion of elements for these embodiments may vary widely with specific design and implementation. Yet, the following exemplary embodiments are presented as examples teaching of the making and use of the invention. The scope of the invention should not be construed as being limited to only the teaching examples. Rather, the attached claims define the scope of the invention.

Figure 1A:
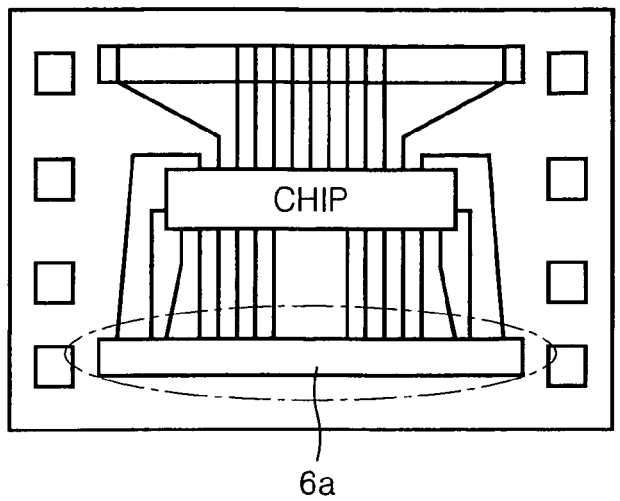
Figure 1B:
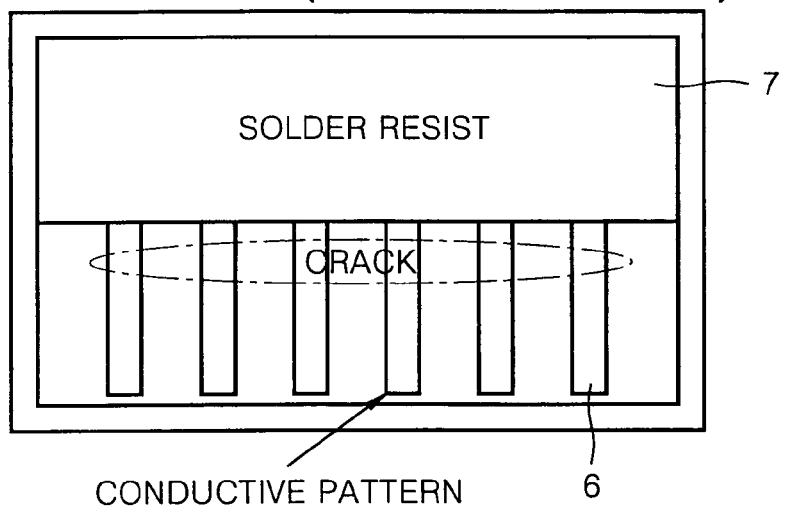
Figure 1C:
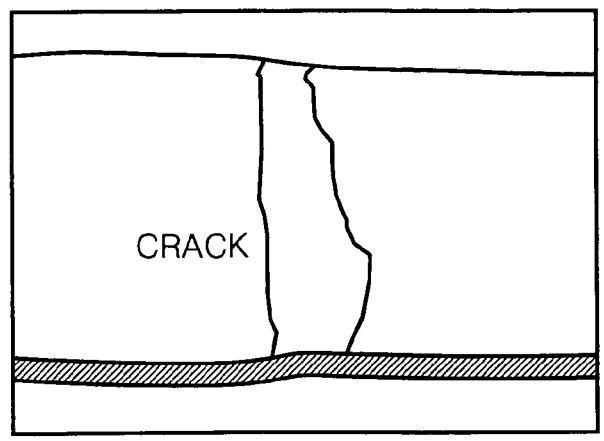
Figure 2:
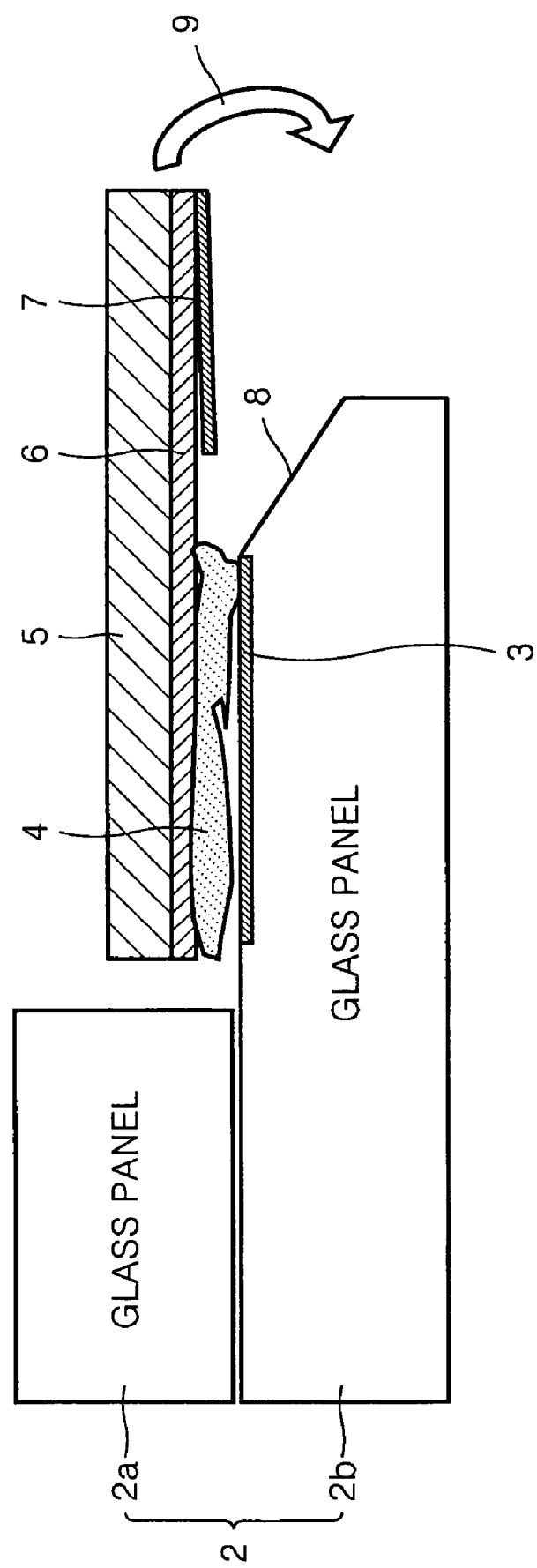
Figure 3A:
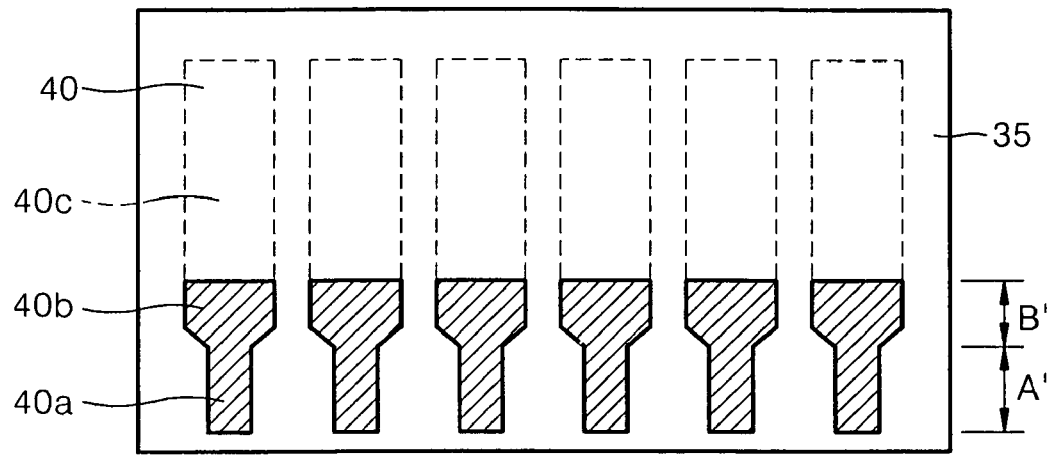
FIGS. 3A, 3B, and 3C variously illustrate one embodiment of the invention drawn to an example wherein a glass panel is connected to a TAB package.
Figure 3B:
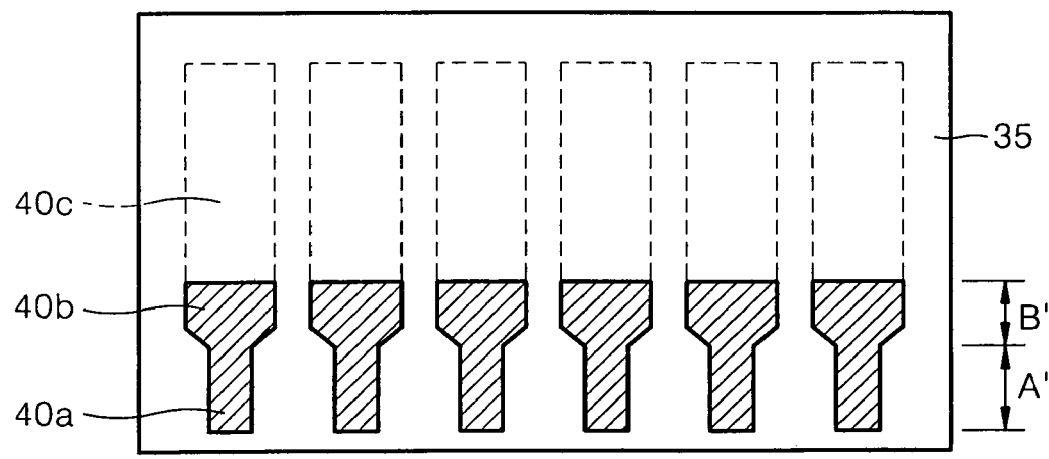
Figure 3B:
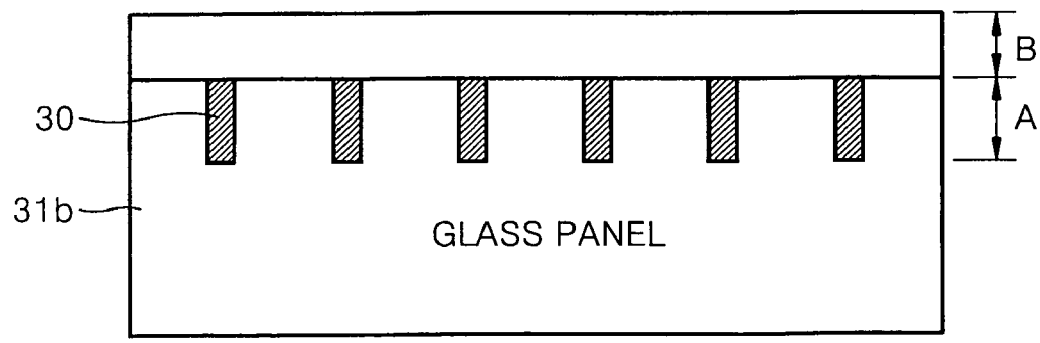
Figure 3C:
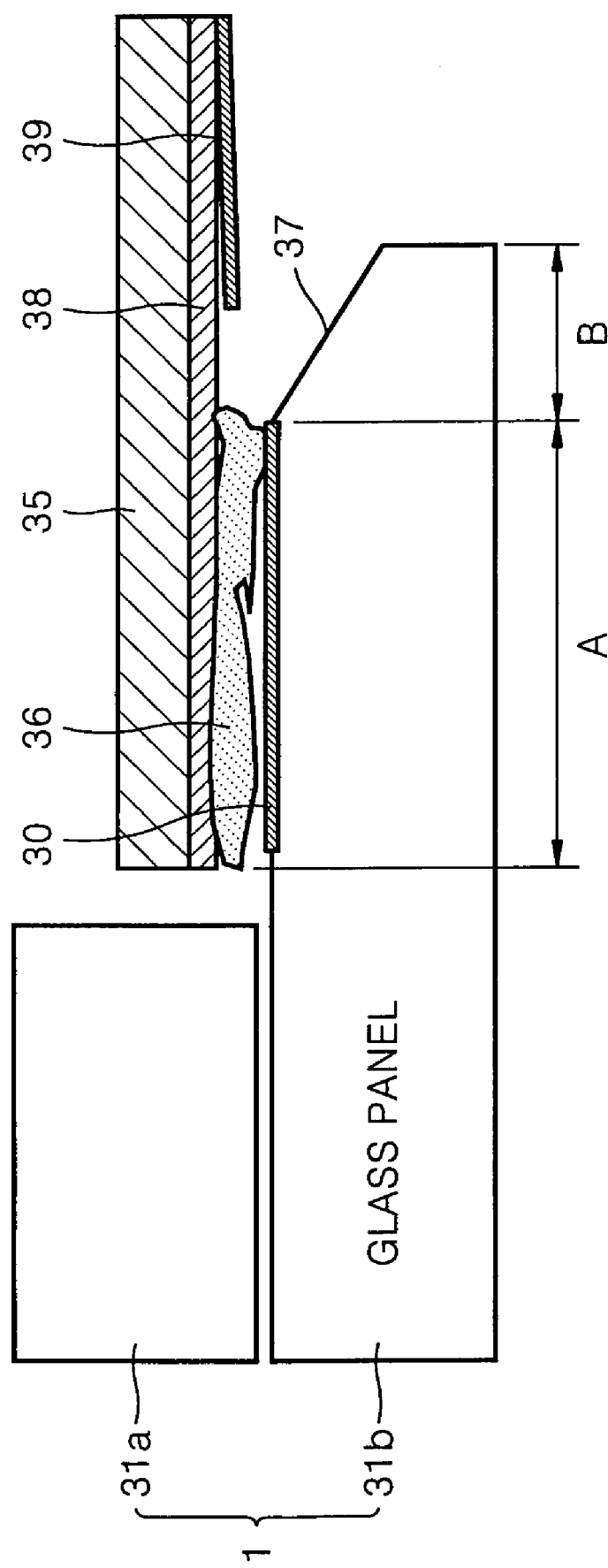

FIGS. 3A, 3B, and 3C illustrate one embodiment of the invention. A glass panel 31 comprising a cover panel 31a and a connection panel 31b will be used as an example of a host device element having a connection surface. The term "element" in this context should be broadly construed as comprising in addition to glass panels of all shapes and sizes, printed circuit boards (PCBs), electrical connections, such as wires, pads, jacks, panels, etc., ceramic and/or plastic components. Further, a "connection pattern" formed on a connection surface of any one of these host device elements may have any reasonable geometry and may take many different forms (e.g., leads, pads, jacks, conductive regions, etc.). Thus, the term "connection pattern" should be construed to cover these possible design variations well beyond the parallel lead patterns used as examples in FIGS. 3A, 3B, and 3C.

The glass panel 31b comprises in one embodiment a connection region "A" and an edge region "B". In the illustrated example, edge region "B" is formed as a beveled edge 37 of glass panel 31a. A first connection pattern 30 is formed on the connection surface of connection region "A" of glass panel 31b using one of several available, conventional techniques. First connection pattern 30 may be formed from one or more of a variety of common electrically conductive materials (e.g., Cu or a Cu alloy). In some embodiments, connection region "A" is characterized not only by the presence of first connection pattern 30, but also by the presence of mechanical support for a bonded TAB package 35. In contrast, the edge region "B" of glass panels in such embodiments is characterized by the absence of both first connection pattern 30 and material mechanical support for a horizontally (relative to the illustrated example) connected TAB package.

TAB package 35 generally comprises a second connection pattern 38. Second connection pattern 38 may in certain embodiments be electrically and mechanically connected to first connection pattern 30 using ACF 36. As shown in the example illustrated in FIG. 3A, second connection pattern 38 may take the form of a plurality of outer lead portions 40 extending from TAB package 35. Each outer lead portion is characterized in one embodiment by an end portion 40a having a first width, a terminal portion 40c having a second width greater than the first width, and a transition region 40b having a width that varies between the first and second widths.

When TAB package 35 is aligned over glass panel 31b such that the first and second connection patterns 30, 38 can be properly mated and bonded, the end portion 40a of each respective outer lead portion 40 will typically extend across at least some portion of connection region "A" for glass panel 31b. Thus, the respective end portions 40a are mechanically supported by the connection surface. Similarly, the terminal portion 40c of each respective output lead portion 40 is usually far enough away from the region of maximum "flexing" stress, (optionally) supported by a solder resist 39, and/or thick enough in width that cracking of this portion of outer lead portion 40 is generally not a problem.

In contrast, once properly aligned, the transition portion 40b of each respective outer lead portion 40 will overlay the edge region "B" of glass panel 31b. The term "overlay" is used here in conjunction with the illustrated example of FIGS. 3B and 3C, and conventional fabrication processes adapted for use in the bonding of TAB package 35 to glass panel 31b. Thus, the term "overlay" should be construed as covering any connection arrangement or fabrication process wherein the second connection pattern of TAB package 35 is vertically disposed with relation to first connection pattern on glass panel 31b.

When aligned to overlay edge region "B" of glass panel 31b, the transition portion 40b will be unsupported by an underlying region of the connection surface of glass panel 31b. Rather, the folding or bending function associated with TAB package 35 typically requires that some portion of the second connection pattern 38, as formed on the flexible interconnect tape of TAB package 35, remain flexibly unconnected between respective host device elements. In the illustrated example of FIGS. 3B and 3C, the transition portion 40b of each outer lead portion 40 is unsupported over the edge region "B". Since this area is most prone to maximum stress and therefore the greatest potential for cracking, each transition portion 40b is formed with a varying width. This varying width affords much greater mechanical strength to the transition portions 40b and to outer lead portions 40 in general.

The use of leads or connection patterns (e.g., metal PCB traces) having variable widths, while known in a general sense, has not been ascribed to the present use; namely arranging the transition portion of such a lead structure which possesses the greatest resistance to bending-induced mechanical fracture within the area of maximum folding or bending stress in a TAB package used to connect elements in a host device.

Naturally, the width-varying shape of transition portion 40b may take many forms. The illustrated examples show a linearly angled transition portion, but the transition portion might otherwise have a curved (e.g., a bowed inward or outward) shape, etc. The relative dimensions of the end, transition, and terminal portions of the second connection pattern will vary by design taking into account, for example, the nature of the connection surface, the geometry of the first connection pattern, the intended radius of maximum bending or greatest folding angle, etc.

In the embodiment illustrated in FIGS. 3A and 3B, the outer lead portions forming second connection pattern 40 are designed such that the respective end portions 40a are about the same length (A') and (first) width as the length and width of the first connection pattern 30 formed in connection region "A". Similarly, the outer lead portions forming second connection pattern 40 are also designed such that the respective transition portions 40b are about the same length (B') as the length of edge region "B".

Figure 4A:
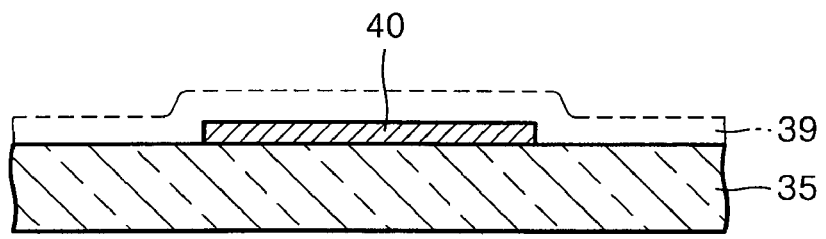
FIGS. 4A, 4B, and 4C further illustrate outer lead portions of an exemplary connection pattern adapted for use within an embodiment of the invention.
Figure 4B:
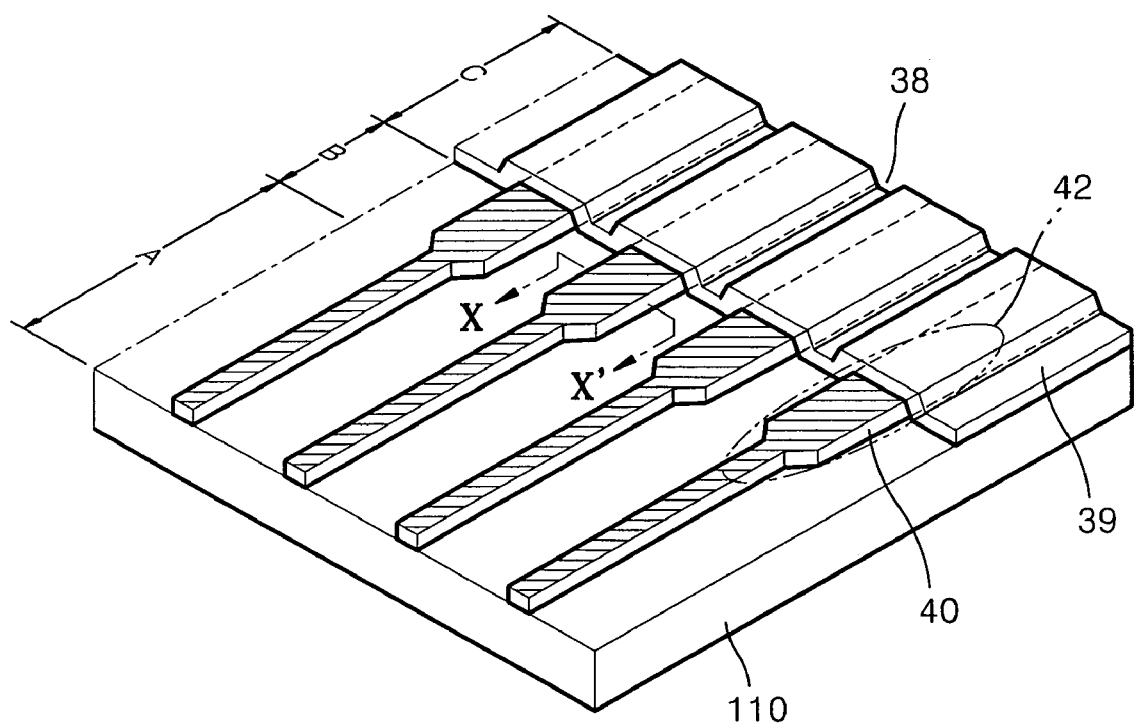
Figure 4C:
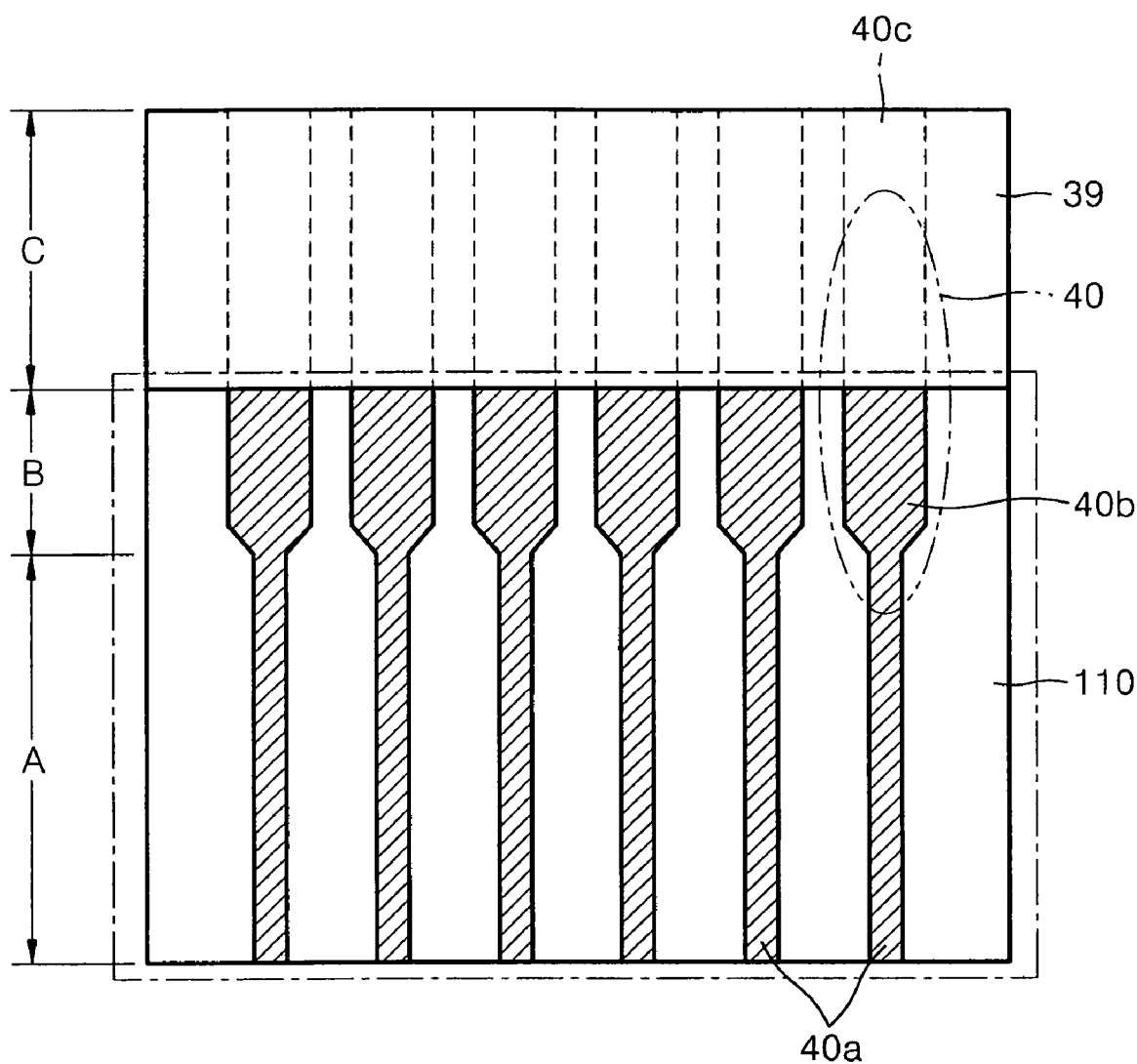

The exemplary second connection pattern of FIGS. 3A, 3B, and 3C is further illustrated in FIGS. 4A, 4B, and 4C.

Here again, a plurality of outer lead portions 40 are formed on one end of TAB package 35 and act as a second connection pattern. A solder resist layer 39 may be optionally provided over the plurality of outer lead portions 40 in a terminal region "C" of TAB package 35. However, where solder resist 39 is provided, some portion of the outer lead portions will protrude (i.e., be exposed beyond) it. This exposed portion 110 of the outer lead portions 40 is adapted for electrical connection to a first connection pattern formed on a host device element.

In the example illustrated in FIGS. 4A, 4B, and 4C, at least the end portion 40a of each outer lead portion 40 is formed from a conductive material, such as copper or a copper alloy, and has a width ranging from about 15 to 50 um and a length ranging from about 100 to 1500 um. The terminal portion 40c of each outer lead portion 40 has a second width ranging from about 20 to 80 um. The transition region 40b of each outer lead portion 40 has a width that varies between the first width and the second width. In some embodiments, the variable width of the transition portion 40b may exceed the second width, but will thereafter transition (e.g., taper) back down to the width of the terminal portion 40c of the outer lead portion 40.

Figure 5A:
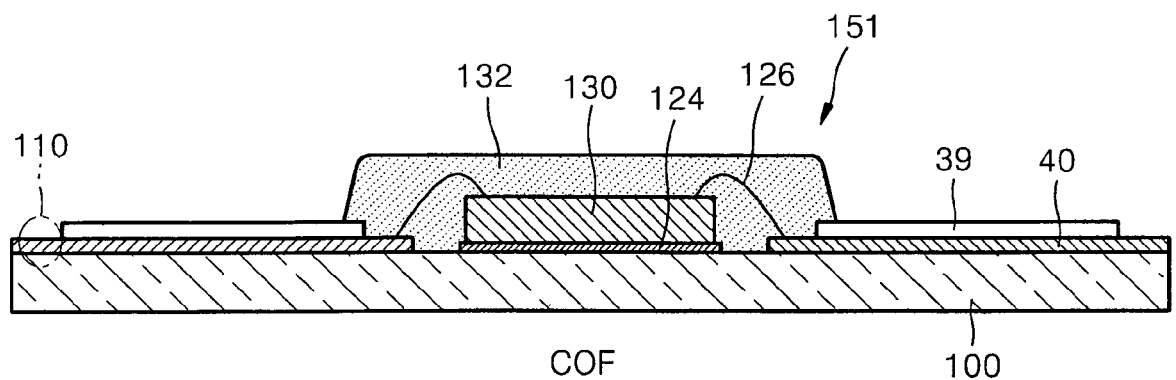
FIGS. 5A and 5B illustrate respective TAB packages susceptible to improvement by incorporation of one or more embodiments of the invention.

Exposed portion 110 of the exemplary second connection pattern is further illustrated in relation to two common TAB package types. The COF package 151 shown in FIG. 5A comprises; a semiconductor die 130 mounted on a base film 100 with adhesive 124 and connected to a second connection pattern 40 via metal wirings 126. Semiconductor die 130 is protected by an encapsulating material 132. The bulk of second connection pattern 40 is protected by solder resist film 39, but also includes exposed portion 110.

Figure 5B:
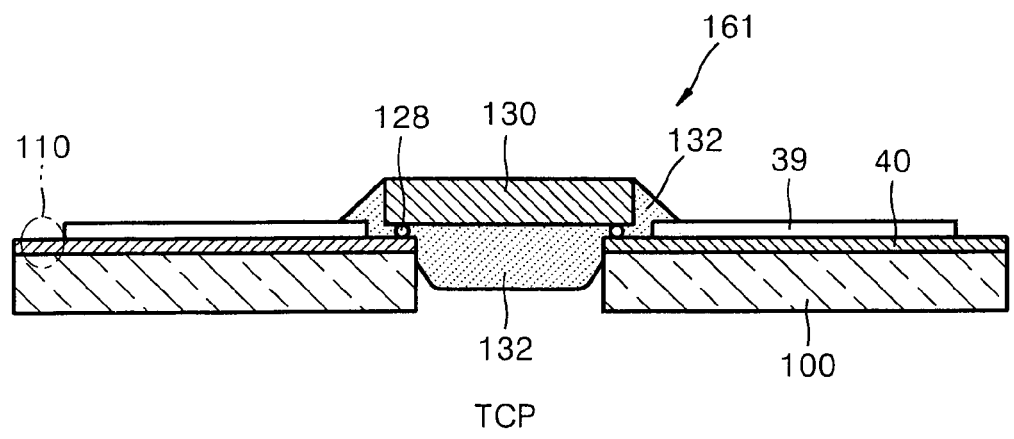

In contrast, the TCP package 161 shown in FIG. 5B comprises; a semiconductor die 130 mounted on a base film 100 and connected to a second connection pattern 40 via solder balls 128. Semiconductor die 130 is protected by encapsulating material 132. The bulk of second connection pattern 40 is protected by solder film 39, but also includes exposed portion 110.

Figure 6:
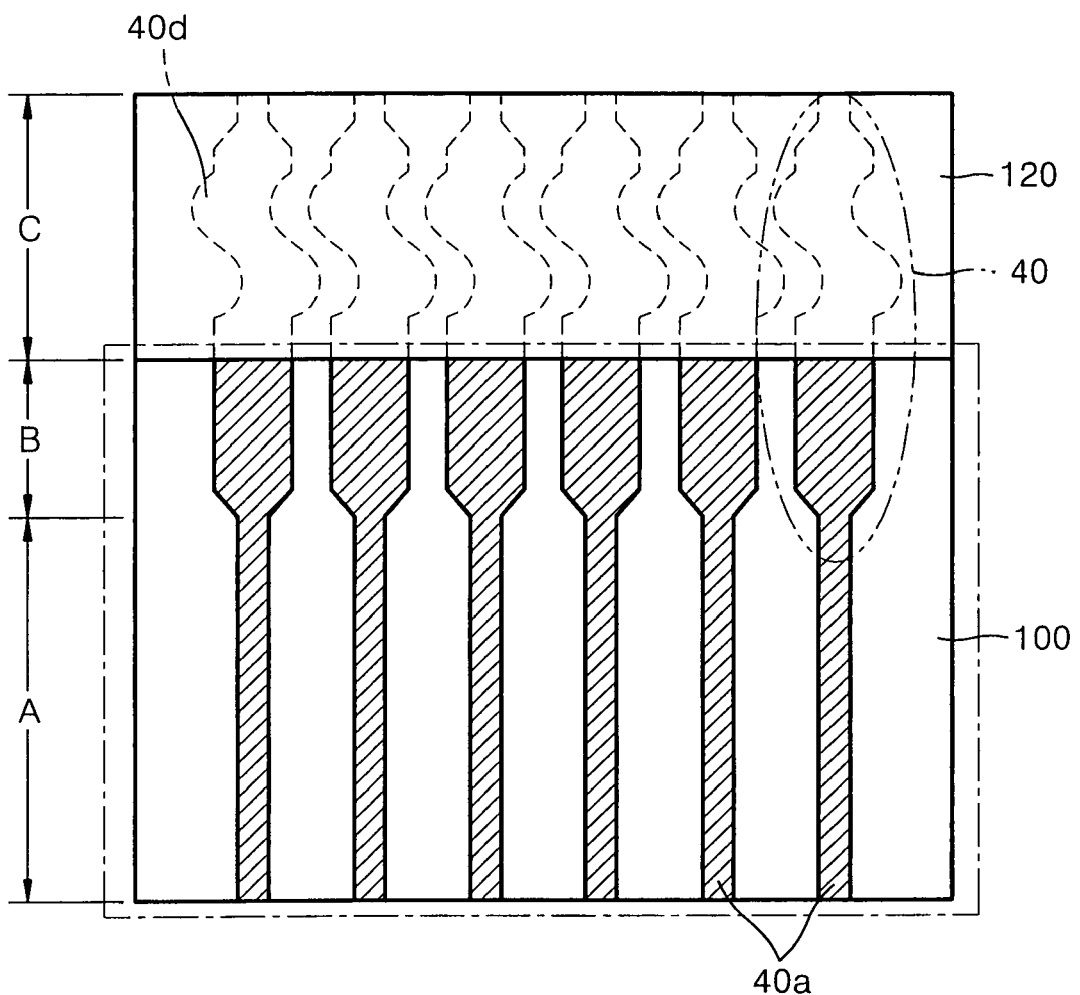
FIG. 6 further illustrates terminal portions of an exemplary connection pattern adapted for use within an embodiment of the invention; and, FIG. 7 is a flowchart illustrating a method adapted to connect a TAB package to a host device element according to one embodiment of the invention.

Within the foregoing exemplary embodiments, the terminal portion 40c of the outer lead portion 40 forming the second connection pattern has been illustrated as having only a linear rectangular shape (i.e., linear parallel sides). However, this need not be the case. It is conventionally understood that for some embodiments an outer lead portion having an S-type portion (e.g., a portion having curved parallel sides) may actually have better immunity to stress induced by disparate heat expansions between base film 100 and connection pattern 40 formed thereon. Thus, FIG. 6 illustrates another embodiment of the invention incorporating a non-rectangular geometry for terminal portion 40c, wherein the terminal portion 40c of the outer lead portions 40 comprises an S-type portion 40d.

Having provided a host device element with a suitable connection surface which will typically incorporate an edge surface formed by a beveled outer edge of the connection surface, and having provided a TAB package with suitable outer lead portions, a manufacturing method may be implemented to yield the benefits described above.

Figure 7:
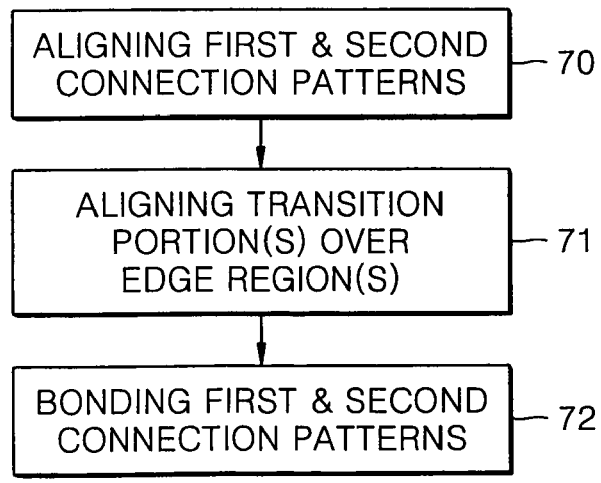

FIG. 7 generally describes one embodiment of this method. This method is adapted to produce a host device comprising two elements, wherein at least one of the elements is adapted to fold-over or bend around the other element while maintaining reliable electrical connection through the use of a flexible TAB package connection. Execution of the exemplary manufacturing method presupposes provision of the host device element to be connected and a TAB package similar to the examples described above.

With these materials in hand, the method begins by aligning the first connection pattern formed on the connection surface of the host device element with the second connection pattern (more particularly, e.g., the end portions of the second connection pattern) formed on the TAB package (71). In some embodiments this alignment step will comprises a "wide-wise" positioning wherein some width portion of the first connection pattern is aligned with some width portion of the second connection pattern. Next, the transition portions of the second connection pattern are aligned with an edge portion of the host device element (72). In some embodiments, this alignment step will comprise a "length-wise" positioning wherein the transition portions of the second connection pattern are positioned to overlay the edge portion of a host device element, such as a glass panel.

Thus, in some embodiments of the invention, the foregoing alignment steps may be performed in any order and may be performed in a single fabrication step. Taken in sequence or combination, however, the alignment steps (70, 71) essentially position the second connection pattern formed in the TAB package over the first connection pattern formed on the connection surface of a host device element, such that the first and second connection patterns may be electrically connected with the transition portions of the second connection pattern being positioned to overlay the edge portion of the host device element. Once these alignment steps are performed, the first and second connection patterns are bonded together using one of several conventional techniques (e.g., using an ACF).

Other advantages will become apparent in the many design variations and modifications readily suggested by the foregoing exemplary embodiments. Such variations and modifications fall within the scope of the invention as defined by the attached claims.

What is claimed is:

1. A device, comprising:
   a panel comprising a connection surface formed adjacent an edge region of the panel, and a first conductive connection pattern formed on the connection surface; and,
   a tape automated bonding (TAB) package, comprising:
      a base film having a second conductive connection pattern formed thereon, the second conductive connection pattern comprising at least one lead comprising an outer lead portion and an inner lead portion;
      a semiconductor die mounted to the base; film, the semiconductor die being physically adjacent to and electrically bonded to the inner lead portion;
      wherein the outer lead portion comprises:
         an end portion having a first width,
         a terminal portion having a second width greater than the first width and being adjacent to the inner lead portion, and,
         a transition region having a width that varies between the first and second widths;
      wherein the end portion is aligned with and bonded to the first conductive connection pattern such that the transition region overlies the edge region, and
      wherein the terminal portion is interposed between the inner lead portion and the transition region and the transition region is interposed between the terminal portion and the end portion.

2. The device of claim 1, wherein the semiconductor die is connected to the inner lead portion through a solder ball.

3. The device of claim 1, wherein the TAB package further comprises a solder resist film formed on the base film and the terminal portion, and wherein the end portion and the transition region are exposed with respect to the solder resist film.

4. The device of claim 3, wherein the transition region has a linearly angled shape, wherein the end portion extends to one edge of the base film.

5. The device of claim 1, wherein the end portion is linear.

6. The device of claim 1, wherein the end portion extends to one edge of the base film.

7. The device of claim 1, wherein the first width is a width in the range of about 15 um to 50 um, and wherein the second width is a width in the range of about 20 um to 80 um.

8. The device of claim 1, wherein the edge region comprises a beveled edge of the panel.

9. The device of claim 1, wherein at least a part of the end portion is disposed in the edge region.

10. The device of claim 1, wherein the base film is bent at a position on which the transition region is formed.

11. The device of claim 1, wherein the first conductive connection pattern and the second conductive connection pattern are bonded together with an ACF.

12. The device of claim 1, further comprising a first film disposed over the terminal portion, wherein the end portion and transition region are exposed with respect to the first film.

13. The device of claim 12, wherein the first film includes a solder resist film.

14. The device of claim 1, wherein the second; conductive connection pattern comprises a plurality of leads. each comprising an inner lead portion and an outer lead portion, wherein for at least a majority of the plurality of leads the semiconductor die is mounted to the base film and electrically connected to the inner lead portion;

and the outer lead portion comprises:

an end portion having a corresponding end portion width, a terminal portion having a corresponding terminal portion width greater than the end portion width and being adjacent to the inner lead portion, and a transition region having a width that varies between the corresponding end portion and terminal portion widths;

wherein the end portion is connected to the first conductive connection pattern such that the transition region overlies the edge region, and wherein the terminal portion is interposed between the inner lead portion and the transition region and the transition region is interposed between the terminal portion and the end portion.

15. The device of 14, wherein the end portion widths and the first width are all substantially the same and the terminal portion widths and the second width are all substantially the same.

16. A device, comprising:

a glass panel and a printed circuit board (PCB) flexibly connected via a tape automated bonding (TAB) package, wherein the glass panel comprises a connection pattern formed on a connection surface, and an edge region formed by a beveled outer edge of the connection surface; and wherein the TAB package comprises a semiconductor die and an outer lead portion, the outer lead portion comprising an end portion having a first width aligned with and bonded to the connection pattern; a terminal portion having a second width greater than the first width and being; physically adjacent to and electrically bonded to the semiconductor die, and a transition portion; interposed between the terminal portion and the end portion having a width that varies between the first and second widths arid overlaying the edge portion of the glass panel.

17. The device of claim 16, wherein the TAB package comprises a Chip-On-Film (COF) package or a Tape Carrier Package (TCP).

18. The device of claim 16, wherein the terminal portion of the outer lead portion comprises an S-type portion.

19. The device of claim 16, wherein the transition portion of the outer lead has a linearly angled shape or a curved shape.

* * * * *